United States Patent
Vail et al.

(10) Patent No.: US 8,945,980 B2
(45) Date of Patent: *Feb. 3, 2015

(54) ALKALI METAL-DOPED SOLUTION-PROCESSED METAL CHALCOGENIDES

(71) Applicant: Sharp Laboratories of America, Inc., Camas, WA (US)

(72) Inventors: Sean Vail, Vancouver, WA (US); Gary Foley, Portland, OR (US); Alexey Koposov, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 77 days.

This patent is subject to a terminal disclaimer.

(21) Appl. No.: 13/773,283

(22) Filed: Feb. 21, 2013

(65) Prior Publication Data

US 2014/0162400 A1    Jun. 12, 2014

Related U.S. Application Data

(63) Continuation-in-part of application No. 13/719,052, filed on Dec. 18, 2012, which is a continuation-in-part of application No. 13/711,356, filed on Dec. 11, 2012, which is a continuation-in-part of application No. 13/674,005, filed on Nov. 10, 2012, now Pat. No. 8,809,113.

(51) Int. Cl.
| | | |
|---|---|---|
| H01L 21/00 | (2006.01) | |
| H01L 21/02 | (2006.01) | |
| H01L 31/032 | (2006.01) | |

(52) U.S. Cl.
CPC .... *H01L 21/02628* (2013.01); *H01L 21/02491* (2013.01); *H01L 21/02568* (2013.01); *H01L 21/02614* (2013.01); *H01L 31/0322* (2013.01); *H01L 21/02425* (2013.01)
USPC ....... 438/102; 438/95; 438/478; 257/E21.464

(58) Field of Classification Search
USPC .......................................... 438/102, 478, 95
See application file for complete search history.

(56) References Cited

U.S. PATENT DOCUMENTS

| | | | |
|---|---|---|---|
| 5,985,691 A | 11/1999 | Basol et al. | |
| 6,127,202 A | 10/2000 | Kapur et al. | |

(Continued)

OTHER PUBLICATIONS

D. B. Mitzi et al.; "A High-Efficiency Solution-Deposited Thin-Film Photovoltaic Device", Advanced Materials 2008, 20, 3657-3662.

(Continued)

*Primary Examiner* — Alexander Ghyka
(74) *Attorney, Agent, or Firm* — Law Office of Gerald Maliszewski; Gerald Maliszewski

(57) ABSTRACT

A method is provided for forming an alkali metal-doped solution-processed metal chalcogenide. A first solution is formed that includes a first material group of metal salts, metal complexes, or combinations thereof, dissolved in a solvent. The first material group may include one or more of the following elements: copper (Cu), indium (In), and gallium (Ga). An alkali metal-containing material is added to the first solution, and the first solution is deposited on a conductive substrate. The alkali metal-containing material may be sodium (Na). An alkali metal-doped first intermediate film results, comprising metal precursors from corresponding members of the first material group. Then, thermally annealing is performed in an environment of selenium (Se), Se and hydrogen ($H_2$), hydrogen selenide ($H_2Se$), sulfur (S), S and $H_2$, hydrogen sulfide ($H_2S$), or combinations thereof. The metal precursors in the alkali metal-doped first intermediate film are transformed, and an alkali metal-doped chalcogenide layer is formed.

21 Claims, 5 Drawing Sheets

(56) References Cited

U.S. PATENT DOCUMENTS

| | | | |
|---|---|---|---|
| 7,897,020 | B2 | 3/2011 | Mackie et al. |
| 8,134,150 | B2 | 3/2012 | Mitzi et al. |
| 2007/0224479 | A1* | 9/2007 | Tadokoro et al. ............... 429/30 |
| 2009/0145482 | A1 | 6/2009 | Mitzi et al. |
| 2010/0267222 | A1* | 10/2010 | Robinson et al. ............ 438/502 |
| 2011/0206599 | A1 | 8/2011 | Keszler et al. |
| 2012/0027694 | A1* | 2/2012 | Thijssen et al. ................. 424/48 |

OTHER PUBLICATIONS

D. B. Mitzi et al,, "Hydrazine-Based Deposition Route for Device-Quality CIGS Films", Thin Solid Films 2009, 517, 2158-2162.

T. K. Todorov et al., "Solution-Processed Cu(In,Ga)(S,Se)2 Absorber Yieiding a 15.2% . . . ", Progress in Photovoltaics:Research and Applications 2012, doi:10.1002/pip.1253.

W. Wang, Y-W. Su and C-H. Chang, "Inkjet Printed Chalcopyrite CuInxGa1-x Se2 Thin Film Solar Cells", Solar Energy Materials & Solar Cells 2011, 95, 2616-2620.

W. Wang et al., "8.01% CuInGaSe2 Solar Cells Fabricated by Air-Stable Low-Cost Inks", Physical Chemistry Chemical Physics 2012, 14, 11154-11159.

D. B. Mitzi and M. W. Copel, "Hydrazine-Free Solution Deposition of Chalcogenide Films", US8, 134, 150 B2, 2008.

U. P. Singh and S. P. Patra, "Progress in Polycrystalline Thin-Film Cu(ln,Ga)Se2 Solar cells", International Journal of Photoenergy, vol. 2010, Article ID 468147.

Y. Jeong et al., "Field Modulation in Na-Incorporated Cu(ln,Ga)Se2 (CIGS) Poycrystalline Films Influenced by Alloy-Hardening . . . ", Nanoscale Research Letters 2011, 6:581.

M. B. Ård, K. Granath and L. Stolt, "Growth of Cu(ln,Ga)Se2 Thin Films by Coevaporation Using Alkaline Precursors", Thin Solid Films 2000, 361-362, 9-16.

J. H. Yun et al., "Fabrication of CIGS Solar Cells with a Na-doped Mo Layer on a Na-Free Substrate", Thin Solid Films 2007, 515, 5876-5879.

Y. M. Shin, D. H. Shin, "Effect of Na Doping Using Na2S on the Structure and Photovoltaic Properties of CIGS Solar Cells", Current Applied Physics 2011, 11, S59-S64.

\* cited by examiner

ALKALI METAL-DOPED SOLUTION-PROCESSED METAL CHALCOGENIDES

RELATED APPLICATION

The application is a Continuation-in-Part of an application entitled, SOLUTION-PROCESSED METAL SELENIDE SEMICONDUCTOR USING DEPOSITED SELENIUM FILM, invented by Sean Vail et al., Ser. No. 13/719,052, filed on Dec. 18, 2012;

which is a Continuation-in-Part of an application entitled, ELECTROCHEMICAL SYNTHESIS OF SELENIUM NANOPARTICLES, invented by Wei Pan et al., Ser. No. 13/711,356, filed on Dec. 11, 2012;

which is a Continuation-in-Part of an application entitled, SOLUTION-PROCESSED METAL SELENIDE SEMICONDUCTOR USING SELENIUM NANOPARTICLES, invented by Sean Vail et al., Ser. No. 13/674,005, filed on Nov. 10, 2012. The above-mentioned applications are incorporated herein by reference.

BACKGROUND OF THE INVENTION

1. Field of the Invention

This invention generally relates to alkali-doped metal chalcogenides and, more particularly, to a processes for forming sodium-doped metal chalcogenides using solutions of metal precursors.

2. Description of the Related Art

Metal and mixed-metal chalcogenides represent important classes of semiconductor materials for electronic and photovoltaic (PV) applications. In particular, copper indium gallium diselenide ($CuIn_{1-x}Ga_xSe_2$ or CIGS) has emerged as a promising alternative to other existing thin-film technologies. Overall, CIGS exhibits a direct and tunable energy band gap, high optical absorption coefficient in the visible to near-infrared (NIR) spectrum and has demonstrated power conversion efficiencies (PCEs)>20%. Conventional CIGS fabrication (vacuum) processes typically involve either sequential or co-evaporation (or sputtering) of copper (Cu), indium (In), and gallium (Ga) metal onto a substrate followed by annealing in an atmosphere containing a selenium source to provide the final CIGS absorber layer.

In contrast to vacuum approaches, which create an environment to control variables such as the gases introduced and pressure, non-vacuum methods offer significant advantages in terms of both reduced cost and high throughput manufacturing capability. Electrodeposition or electroplating of metals (from metal ions dissolved in solution) onto conductive substrates represents an alternative CIGS fabrication strategy. Finally, CIGS fabrication via deposition of mixed binary, ternary, and/or quaternary nanoparticles of copper, indium, gallium, and selenium (nanoparticle "inks") embodies another non-vacuum approach.

In addition to the approaches described above, a number of alternative approaches and hybrid strategies have been reported with varying degrees of success. Overall, CIGS fabrication via solution-based approaches appears to offer a convenient, low-cost option. According to this method, metal salts or metal complexes (precursors) of copper, indium, and gallium are dissolved in a solvent to form a CIGS ink and subsequently deposited on a substrate to form a film using conventional methods.

Mitzi et al. described a solution-based CIGS absorber layer deposition strategy using homogenous solutions of Cu, In, Ga and Se (and optionally sulfur) obtained by dissolution in hydrazine without the requirement for post-deposition, high-temperature selenization.[1-3] Subsequently, a hydrazine-free approach was reported whereby isolated hydrazinium-based precursors could be deposited to form metal chalcogenide composite films.[4] More recently, Todorov et al. described a 15.2% PCE for a thin-film solar cell with a solution-processed $Cu(In,Ga)(S,Se)_2$ (CIGS) absorber, which represents the highest reported value for a pure solution deposition method.[5] With the exception of the aforementioned cases, solution-based deposition methods for fabricating a CIGS absorber layer have historically demonstrated significantly lower performance compared to vacuum and/or electrodeposition processes.

Keszler et al. described a solution-based approach for the fabrication of low contamination metal chalcogenides in aqueous media.[6] In general, the formulation consists of aqueous metal chalcogenide precursors as a mixture of metal cation salts, formate anions, and a source of chalcogen (selenium, sulfur) in the form of thermally labile precursors including thiourea, thioformamide, selenourea, selenoformamide, etc. Overall, this method offers both environmentally favorable processing and low CIGS film contamination due to the careful selection of appropriate precursor materials. Finally, Wang et al. reported an inkjet printing method whereby the CIGS precursor film was printed on molybdenum (Mo)-coated substrates from a solution of Cu, In and Ga sources containing ethylene glycol and ethanolamine.[7] Following thermal selenization and subsequent CIGS device integration, a PCE of 5.04% was obtained. Subsequently, Wang et al. demonstrated a PCE exceeding 8% for CIGS solar cells through careful optimization of Cu, In, and Ga precursor formulations.[8]

As previously mentioned, solution processing methods for CIGS generally suffer from lower performance relative to conventional vacuum and electrodeposition approaches, with the exception of the aforementioned hydrazine-based method. In response to this, appropriate doping strategies offer the potential to dramatically improve the morphology and PV behavior of the CIGS absorber, thereby decreasing the performance "gap" between solution and vacuum processes. Fortunately, CIGS exhibits a robust tolerance towards defects and/or impurities. In light of this, benefits from doping have been successfully exploited through improvements in CIGS layer morphology (grain size) that ultimately translate into better device performance primarily through a reduction of grain boundaries, which effectively suppresses recombination phenomena.

One conventional strategy for improving the performance of CIGS solar cells involves using soda-lime glass (SLG) substrates, through which Na migration during thermal treatment affords a Na-doped CIGS absorber layer. In the case of SLG, Na diffusion proceeds through the Mo back contact which further necessitates control over Mo properties. Indeed, a number of explanations and models have been proposed to rationalize the beneficial impact of Na-doping on CIGS solar cell performance.[9,10] However, the dominant phenomena appear to manifest themselves in terms of improvements in (1) output voltage, (2) CIGS grain morphology or, in some cases, both (1) and (2).

In addition to the straightforward exploitation of Na migration from SLG during thermal treatment as a method for realizing a Na-containing CIGS absorber layer (passive approach), alternative (active) strategies for Na-doping of CIGS have been reported. Árd et al. described CIGS growth on Mo-substrates containing layers of NaF deposited prior to CIGS deposition.[11] For this study, the substrates consisted of SLG both with and without Na-diffusion barriers. With respect to CIGS solar cell devices, improvements in grain structure, film texture, and surface flatness were observed when NaF precursor layers were employed relative to both Na-free and Na-poor samples. In terms of device performance, solar cell efficiency was shown to increase in response to modest additions of Na. Yun et al. demonstrated improved photovoltaic properties for CIGS solar cells fabricated on a Na-free substrate (alumina) by employing Na-doped Mo as the bottom layer of a Mo back contact.[12] According to this method. Na-doped Mo was shown to function as a Na source material wherein control over Na content was realized by tuning the thickness of the Na-doped Mo layer without the need for an alkali diffusion barrier. Shin et al. employed a Na-doping strategy by incorporating an $Na_2S$ precursor at three distinct points in a three-stage co-evaporation process for CIGS fabrication.[13] However, it was determined that the performance of CIGS solar cells employing external Na-doping of CIGS fabricated on Mo/Corning glass substrates was worse than devices prepared using conventional methods. Mackie et al. provided a method for alkali doping of PV materials whereby the alkali-containing transition metal layer was fabricated by sputtering from a first target comprising a transition metal and a second target comprising an alkali metal.[14]

Not surprisingly, the high performance demonstrated for CIGS solar cells fabricated by conventional (vacuum or other) processes as compared to solution-based methods have dominated the research and development landscape until only recently. Nevertheless, a few examples have been previously provided that warrant discussion. Basol et al. described a method for fabricating compound semiconductor films using a source material, which may be provided in the form of an ink from particles in a powder form.[15] Furthermore, the source material includes Group IB-IIIA alloy containing particles containing at least one Group IB-IIIA alloy phase. Subsequently, a precursor film prepared from the source material is thermally treated in an appropriate atmosphere to furnish a composite film comprising a Group IB-IIIA-VIA compound. Finally, Kapur et al. provided a method for fabricating a compound film that involves the preparation and subsequent deposition of a source material to form a preparatory film, thermally treating the preparatory film in an appropriate atmosphere to form a precursor film which further includes providing material to the precursor film to form the compound film.[16] In this case, the source material comprises oxide-containing particles including Group IB and IIIA elements, while the precursor film includes non-oxide Group IB and IIIA elements. Finally, the compound film includes a Group IB-IIIA-VIA compound and optionally may contain a dopant.

1. D. B. Mitzi, M. Yuan, W. Liu, A. J. Kellock, S. J. Chey, V. Deline and A. G. Schrott, "A High-Efficiency Solution-Deposited Thin-Film Photovoltaic Device", *Advanced Materials* 2008, 20, 3657-3662.

2. D. B. Mitzi, M. Yuan, W. Liu, A. J. Kellock, S. J. Chey, L. Gignac and A. G. Schrott, "Hydrazine-Based Deposition Route for Device-Quality CIGS Films", *Thin Solid Films* 2009, 517, 2158-2162.

3. D. B. Mitzi, W. Liu and M. Yuan, "Photovoltaic Device with Solution-Processed Chalcogenide Absorber Layer", US2009/0145482 A1.

4. D. B. Mitzi and M. W. Copel, "Hydrazine-Free Solution Deposition of Chalcogenide Films", US8, 134, 150 B2.

5. T. K. Todorov, O. Gunawan, T. Gokmen and D. B. Mitzi, "Solution-Processed $Cu(In,Ga)(S,Se)_2$ Absorber Yielding a 15.2% Efficient Solar Cell", *Progress in Photovoltaics: Research and Applications* 2012, doi:10.1002/pip.1253

6. D. A. Keszler and B. L. Clark, "Metal Chalcogenide Aqueous Precursors and Processes to Form Metal Chalcogenide Films", US2011/0206599 A1

7. W. Wang, Y-W. Su and C-H. Chang, "Inkjet Printed Chalcopyrite $CuInxGa_{1-x}Se_2$ Thin Film Solar Cells", *Solar Energy Materials & Solar Cells* 2011, 95, 2616-2620.

8. W. Wang, S-Y. Han, S-J. Sung, D-H. Kim and C-H. Chang, "8.01% $CuInGaSe_2$ Solar Cells Fabricated by Air-Stable Low-Cost Inks", *Physical Chemistry Chemical Physics* 2012, 14, 11154-11159.

9. U. P. Singh and S. P. Patra, "Progress in Polycrystalline Thin-Film $Cu(In,Ga)Se_2$ Solar cells", *International Journal of Photoenergy*, Volume 2010, Article ID 468147.

10. Y. Jeong, C-W. Kim, D-W. Park, S. C. Jung, J. Lee and H-S. Shim, "Field Modulation in Na-Incorporated Cu(In,Ga) $Se_2$ (CIGS) Polycrystalline Films Influenced by Alloy-Hardening and Pair-Annihilation Probabilities", *Nanoscale Research Letters* 2011, 6:581.

11. M. B. Ård, K. Granath and L. Stolt, "Growth of Cu(In, Ga)$Se_2$ Thin Films by Coevaporation Using Alkaline Precursors", *Thin Solid Films* 2000, 361-362, 9-16.

12. J. H. Yun, K. H. Kim, M. S. Kim, B. T. Ahn, S. J. Ahn, J. C. Lee and K. H. Yoon, "Fabrication of CIGS Solar Cells with a Na-doped Mo Layer on a Na-Free Substrate", *Thin Solid Films* 2007, 515, 5876-5879.

13. Y. M. Shin, D. H. Shin, "Effect of Na Doping Using $Na_2S$ on the Structure and Photovoltaic Properties of CIGS Solar Cells", *Current Applied Physics* 2011, 11, S59-S64.

14. N. M. Mackie, D. R. Julino and R. B. Zubeck, "Method for Alkali Doping of Thin Film Photovoltaic Materials", U.S. Pat. No. 7,897,020 B2.

15. B. M. Basol, V. K. Kapur, A. T. Halani, C. R. Leidholm and R. A. Roe, "Method of Making Compound Semiconductor Films and Making Related Electronic Devices", U.S. Pat. No. 5,985,691.

16. V. K. Kapur, B. M. Basol, C. R. Leidholm and R. A. Roe, "Oxide-Based Method of Making Compound Semiconductor Films and Making Related Electronic Devices", U.S. Pat. No. 6,127,202.

It would be advantageous if a solution-based process existed for the fabrication of an alkali-doped metal chalcogenide, such as a sodium-doped Cu—In—Ga—Se (CIGS) composite material.

SUMMARY OF THE INVENTION

As an alternative to the aforementioned examples, a method is described for the deliberate incorporation of an alkali metal into a metal chalcogenide material through the deposition of homogenous solutions comprising dissolved metal precursors, together with soluble sources of alkali metals. For example, the incorporation of sodium (Na) into copper (Cu)-indium (In)-gallium (Ga)-selenium (Se) (CIGS) via solution-processed methods through direct deposition of a soluble, Na-doped Cu, In and Ga precursor formulation (homogenous solution) provides a versatile approach for CIGS absorber layer fabrication on substrates that cannot serve as a functional Na source similar to soda-lime glass (SLG). Conveniently, the Cu—In—Ga—Na formulation and subsequent deposition processes for fabricating a CIGS precursor film can be performed using conventional methodologies without the need for strict environmental control.

As an alternative to a potentially hazardous solution-based approach using hydrazine, Na is incorporated as a dopant in CIGS using a solution based approach whereby an intermediate (e.g. mixed-oxide) film of Cu, In, Ga and Na is formed following deposition and thermal annealing of individual layers. The approach takes advantage of low-boiling solvents and weakly coordinating ligands that are removed during the thermal anneal process. Subsequent high temperature selenization of the Cu—In—Ga—Na precursor film "stack" with Se powder in an $H_2$ environment affords Na-doped CIGS. Although the beneficial impact of Na-doping in CIGS by solution processing is evidenced through improved PV performance primarily with respect to open-circuit voltage ($V_{oc}$) and device efficiency (η) relative to control (no Na), modest improvements in short-circuit current ($J_{sc}$) and fill factor (FF) are similarly demonstrated using this approach. Furthermore, the impact of Na doping on CIGS appears to manifest itself in terms of improved CIGS grain size/morphology as confirmed by scanning electron microscope (SEM) cross-sectional analysis versus control CIGS composites (no Na), which is consistent with assertions from the prior art. In the following sections are described details regarding formulation, deposition, device integration, and photovoltaic behaviors of control and Na-doped CIGS solar cells featuring a CIGS absorber layer fabricated by a solution-processed methodology.

Accordingly, a method is provided for forming an alkali metal-doped solution-processed metal chalcogenide. A first solution is formed that includes a first material group of metal salts, metal complexes, or combinations thereof, dissolved in a solvent. The first material group is selected from a first material set. The first material set may include one or more of the following elements: aluminum (Al), antimony (Sb), arsenic (As), bismuth (Bi), cadmium (Cd), chromium (Cr), cobalt (Co), copper (Cu), gallium (Ga), germanium (Ge), gold (Au), indium (In), iridium (Ir), iron (Fe), lead (Pb), manganese (Mn), mercury (Hg), molybdenum (Mo), nickel (Ni), niobium (Nb), osmium (Os), palladium (Pd), platinum (Pt), rhodium (Rh), ruthenium (Ru), silver (Ag), tantalum (Ta), tin (Sn), titanium (Ti), tungsten (W), vanadium (V), zinc (Zn), and zirconium (Zr).

An alkali metal-containing material is added to the first solution, and the first solution is deposited on a conductive substrate. The alkali metal-containing material may include sources of lithium (Li), sodium (Na), potassium (K), cesium (Cs), or combinations of the above-mentioned metals. An alkali metal-doped first intermediate film results comprising metal precursors, formed from corresponding members of the first material group. Then, thermally annealing is performed in an environment of selenium (Se), Se and hydrogen ($H_2$), hydrogen selenide ($H_2Se$), sulfur (S), S and $H_2$, hydrogen sulfide ($H_2S$), or combinations thereof. As a result, the metal precursors in the alkali metal-doped first intermediate film are transformed, and an alkali metal-doped chalcogenide layer is formed that may be either a metal chalcogenide or a mixed (more than one) metal chalcogenide.

Additional details of the above-described method, and a method for forming a Na-doped metal chalcogenide, are provided below.

DETAILED DESCRIPTION

Figure 1:
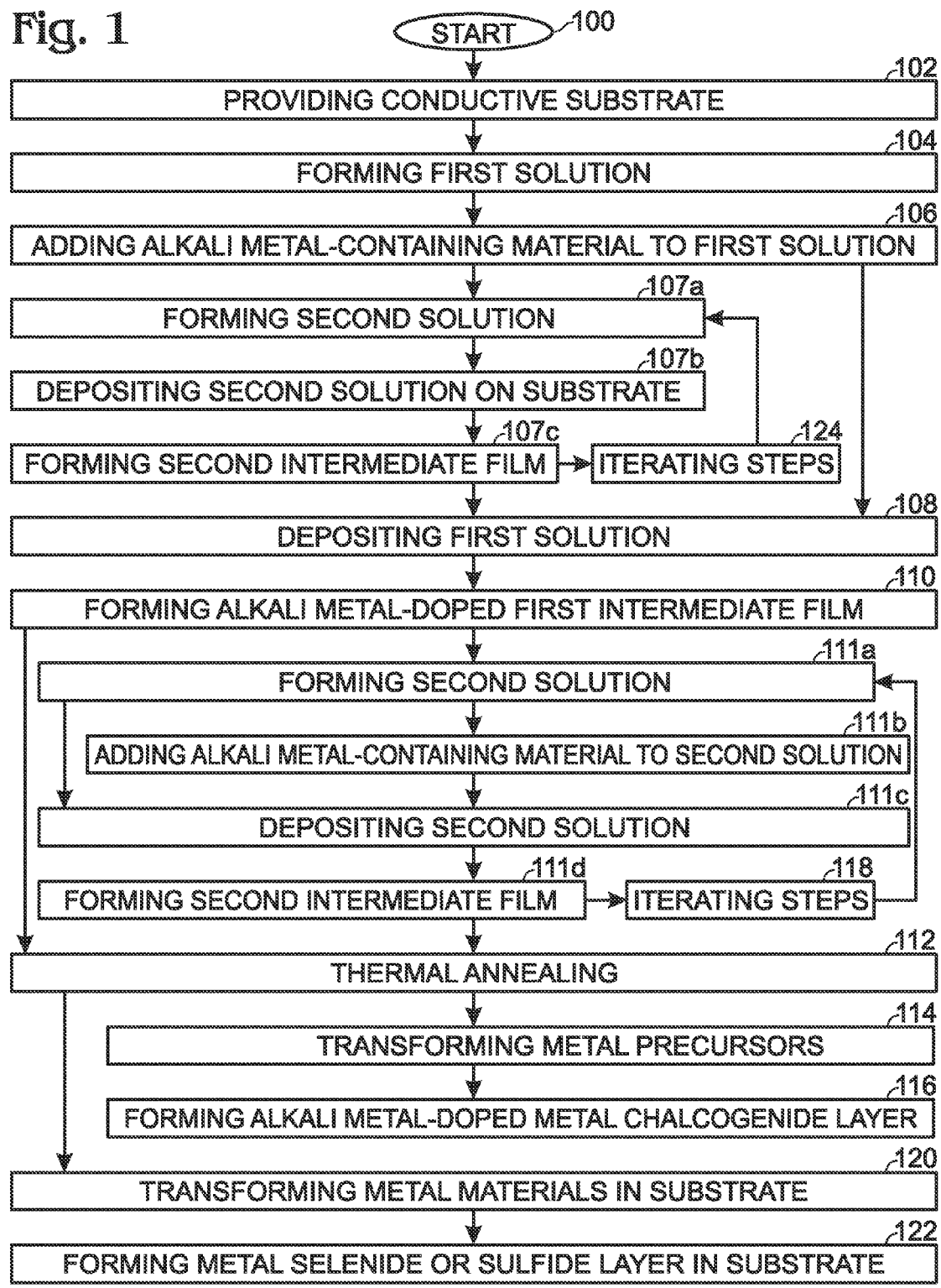
FIG. 1 is a flowchart illustrating a method for forming an alkali metal-doped solution-processed metal chalcogenide.

FIG. 1 is a flowchart illustrating a method for forming an alkali metal-doped solution-processed metal chalcogenide. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method begins at Step 100.

Step 102 provides a conductive substrate. Step 104 forms a first solution including a first material group that may be metal salts, metal complexes, or combinations thereof, dissolved in a solvent. As used herein, a solvent is a mixture of chemicals used to affect dissolution of the metal precursors. More generally, the solvents that make up the majority of the solution (liquid phase) to dissolve the metal precursors often include smaller quantities of functional "additives". These additives may be required to facilitate dissolution of the metal precursors. Furthermore, these additives may be classified as solvents as well.

The first material group is selected from a first material set. The first material set includes at least the following materials: aluminum (Al), antimony (Sb), arsenic (As), bismuth (Bi), cadmium (Cd), chromium (Cr), cobalt (Co), copper (Cu), gallium (Ga), germanium (Ge), gold (Au), indium (In), iridium (Ir), iron (Fe), lead (Pb), manganese (Mn), mercury (Hg), molybdenum (Mo), nickel (Ni), niobium (Nb), osmium (Os), palladium (Pd), platinum (Pt), rhodium (Rh), ruthenium (Ru), silver (Ag), tantalum (Ta), tin (Sn), titanium (Ti), tungsten (W), vanadium (V), zinc (Zn), zirconium (Zr), or combinations thereof.

Step 106 adds an alkali metal-containing material to the first solution. The alkali metal-containing material may include sources of alkali metal such as lithium (Li), sodium (Na), potassium (K), cesium (Cs), or combinations of the above-mentioned metals. Some examples of the alkali-metal containing material may include soluble salts of Li, Na, K, and Cs including formate and/or acetate, although additional salts, complexes, etc. are also possible. Step 108 deposits the first solution on the conductive substrate. The conductive substrate may be one of the following classes of material: metals, metal alloys, metal oxides, mixed metal oxides, or combinations thereof. Some specific examples of materials include aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, fluorine-doped tin oxide, and combinations thereof.

Step 110 forms an alkali metal-doped first intermediate film comprising metal precursors from corresponding members of the first material group. In one aspect, Step 110 forms a first proportion of the alkali metal-doped first intermediate film from either metal oxides or mixed metal oxides. As used herein, the term "intermediate film" refers to a film formed as a result of depositing a solution of dissolved metals salts, metal complexes, and combinations thereof (from a solvent) followed by thermal treatment to remove at least a percentage of solvent and furnish a metal-containing precursor film, whereby some first proportion of the film may be metal oxide or mixed-metal oxide.

Step 112 thermally anneals in an environment that includes at least one of the following: selenium (Se), Se and hydrogen ($H_2$), hydrogen selenide ($H_2Se$), sulfur (S), S and $H_2$, hydrogen sulfide ($H_2S$), or combinations thereof. As a result, Step 114 transforms the metal precursors in the alkali metal-doped first intermediate film. Step 116 forms an alkali metal-doped metal chalcogenide layer. A "metal chalcogenide" is defined herein as a composite material including one or more metals from the first material set, and either Se, S, or both. A doping level for alkali metals corresponding to 0.001-1.0%, relative to total metal content in the resulting metal chalcogenide, is typically employed although higher or lower levels are possible.

As noted above, thermal annealing in the provided atmosphere transforms the intermediate film from metal/mixed-metal precursor (e.g., oxide) to metal/mixed metal chalcogenide. During the thermal process, Se or S reacts with the metal precursor (intermediate film or films). Typically, this annealing process proceeds at high temperatures (e.g., greater than 400° C.) and is an important step in furnishing the resultant alkali metal-doped metal chalcogenide. However, following the deposition of the individual metal precursor solutions to form the intermediate films, a lower temperature thermal process may be employed to furnish the intermediate film, as well as to evaporate solvents. In the interests of simplicity, these lower temperature annealing steps are not explicitly mentioned in the methods described by FIGS. 1 and 2.

In one aspect prior to thermal annealing in Step 112, Step 111a forms a second solution including a second material group with at least one material from the first material set, dissolved in a solvent. Step 111c deposits the second solution on the alkali metal-doped first intermediate film. Step 111d forms a second intermediate film comprising metal precursors from corresponding members of the second material group. Then, transforming the metal precursors in the alkali metal-doped first intermediate film in Step 114 additionally includes transforming metal precursors in the second intermediate film.

In one aspect prior to depositing the second solution on the alkali metal-doped first intermediate film in Step 111c, Step 111b adds an alkali metal-containing material to the second solution. Then, Step 111d forms an alkali metal-doped second intermediate film, and Step 114 transforms metal precursors in the alkali metal-doped second intermediate film.

As represented by reference designator 118, Steps 11 1a, 111c, and 111d can be iteratively performed so that a plurality of intermediate films are formed overlying the alkali metal-doped first intermediate film. Alternatively Steps 111a, 111b, 111c, and 111d can be iteratively performed so that a plurality of alkali metal-doped intermediate films overlying the alkali metal-doped first intermediate film. As another alternative, a plurality of alkali-doped and non-alkali-doped doped films can be sequentially or non-sequentially formed.

In another aspect prior to depositing the first solution, Step 107a forms a second solution including a second material group with at least one material from the first material set group, dissolved in a solvent. Step 107b deposits the second solution overlying and in direct contact with the conductive substrate. Step 107c forms a second intermediate film comprising metal precursors from corresponding members of the second material group. Then, forming the alkali metal-doped first intermediate film in Step 110 includes forming the alkali metal-doped first intermediate film overlying and in direct contact with the second intermediate film. Step 114 transforms the metal precursors in the alkali metal-doped first intermediate film, as well as the metal precursors in the second intermediate film. As represented by reference designator 124, Steps 107a through 107c may be iteratively performed to for a plurality of second intermediate films.

In one aspect, as a result of thermally annealing in Step 112, Step 120 transforms at least some proportion of metal-containing materials in the conductive substrate. Step 122 forms a layer in the conductive substrate of either a metal selenide or a metal sulfide, depending on the environment of Step 112, underlying the alkali metal-doped chalcogenide layer.

Figure 2:
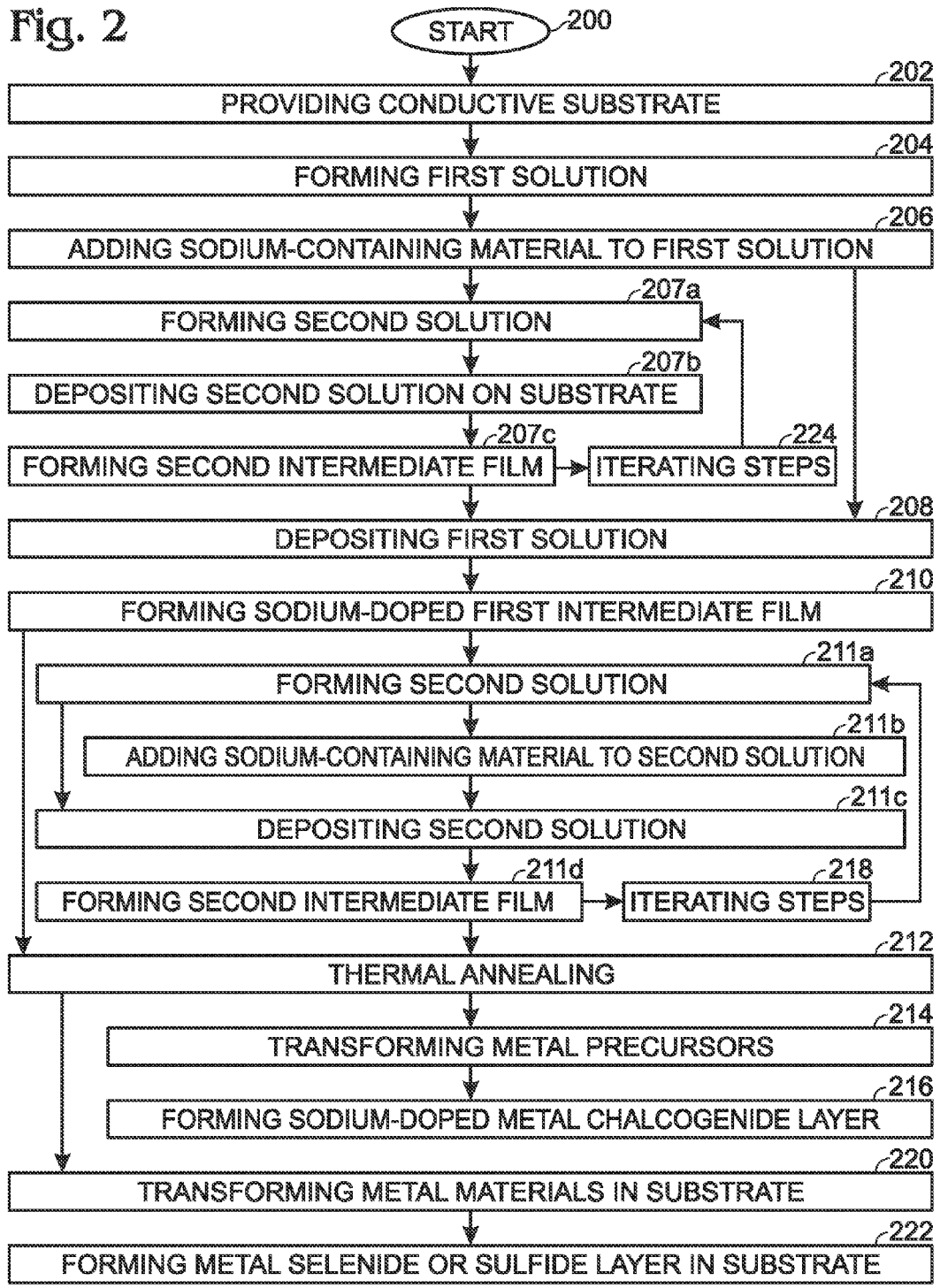
FIG. 2 is a flowchart illustrating a method for forming a sodium-doped solution-processed metal chalcogenide.

FIG. 2 is a flowchart illustrating a method for forming a sodium-doped solution-processed metal chalcogenide. The method begins with Step 200. Step 202 provides a conductive substrate. Examples of conductive substrate materials have been provided above in the explanation of Step 102. Step 204 forms a first solution including a first material group of metal salts, metal complexes, or combinations thereof, dissolved in a solvent. The first material group is selected from a first material set. For example, the first material set may include Cu, In, Ga, or combinations of the above-mentioned materials. Step 206 adds a sodium-containing material to the first solution. Step 208 deposits the first solution on the conductive substrate. Step 210 forms a sodium-doped first intermediate film comprising metal precursors from corresponding members of the first material group.

Step 212 thermally anneals in an environment of Se, Se and $H_2$, $H_2Se$, S, S and $H_2$, $H_2S$, or combinations thereof. As a result, Step 214 transforms the metal precursors in the sodium-doped first intermediate film. Step 216 forms a sodium-doped metal chalcogenide layer, wherein the Se, S, or Se/S content is dependent on the environment provided in Step 212. A doping level for sodium corresponding to 0.001- 1.0%, relative to total metal content in the resulting metal chalcogenide, is typically employed although higher levels are possible. For example, if Step 212 thermally anneals in an environment of Se, Se and $H_2$, $H_2Se$, or combinations of the above-mentioned materials, then Step 216 forms a sodium-doped Cu—In—Ga—Se composite material.

In one aspect prior to thermal annealing in Step 212, Step 211a forms a second solution including a second material group from a material or materials described above in the first material set, dissolved in a solvent. Step 211c deposits the second solution on the sodium-doped first intermediate film. Step 211d forms a second intermediate film comprising metal precursors from corresponding members of the second material group. Then, transforming the metal precursors in the sodium-doped first intermediate film in Step 214 additionally includes transforming metal precursors in the second intermediate film.

In another aspect prior to depositing the second solution on the sodium-doped first intermediate film in Step 211c, Step 211b adds a sodium-containing material to the second solution. Then, Step 211d forms a sodium-doped second intermediate film, and Step 214 transforms metal precursors in the sodium-doped second intermediate film.

As represented by reference designator 218, Steps 211a, 211c, and 211d may be iteratively performed so that a plurality of intermediate films are formed overlying the sodium-doped first intermediate film. Alternatively Steps 211a, 211b, 211c, and 211d can be iteratively performed so that a plurality of sodium-doped intermediate films are formed overlying the sodium-doped first intermediate film. As another alternative, a plurality of sodium-doped and non-sodium-doped doped intermediate films can be sequentially or non-sequentially formed.

In another aspect prior to depositing the first solution, Step 207a forms a second solution including a second material group with a material or materials from the first material set mentioned above, dissolved in a solvent. Step 207b deposits the second solution overlying and in direct contact with the conductive substrate. Step 207c forms a second intermediate film comprising metal precursors from corresponding members of the second material group. Then Step 210 forms the sodium-doped first intermediate film overlying and in direct contact with the second intermediate film, and Step 214 transforms the metal precursors in the sodium-doped first intermediate film, as well as the metal precursors in the second intermediate film. As represented by reference designator 224, Steps 207a through 207c may be iteratively performed to for a plurality of second intermediate films.

In one aspect, as a result of thermally annealing in Step 212, Step 220 transforms at least some proportion of metal-containing materials in the conductive substrate. Step 222 forms a layer in the conductive substrate of either a metal selenide or a metal sulfide, depending on the environment of Step 212, underlying the sodium-doped chalcogenide layer.

Experimental Data

In general, homogenous solutions of metal salts, metal complexes, and combinations thereof in appropriate ratios, either with or without a soluble sodium-containing material, were employed. For the investigation of Na-doping in solution-processed CIGS, a doping level corresponding to 0.25 mol % Na (relative to combined moles of Cu, In and Ga precursor sources) was used. The CIGS solar cells so fabricated were directly compared with control devices fabricated in an identical manner with the exception of Na exclusion.

Cu—In—Ga (or Cu—In—Ga—Na) Ink Deposition:

Metal (precursor) solutions consisting of Cu, In, Ga, and optionally Na, were deposited on molybdenum (Mo/Glass) substrates by sequential spin-coating, followed by brief thermal treatment. The spin-coating/anneal cycles were carried out using formulations as indicated below. Of course, other suitable methods for deposition of the precursor solution can be applied including doctor-blading, drop-casting, or inkjet printing, among others.

Substrate 35-2: Cu—In—Ga (no Na)
Substrate 35-3: Cu—In—Ga (containing 0.25 mol % Na)
CIGS Solar Cell Processing & Integration:

Selenization of the as-deposited Cu—In—Ga (and Cu—In—Ga—Na) precursor films was performed with selenium (Se) powder in $H_2$ atmosphere. Subsequently, a thin cadmium sulfide (CdS) film was deposited via chemical bath deposition (CBD).

Next, zinc oxide (ZnO) and indium tin oxide (ITO) were sequentially deposited by vacuum sputtering. Aluminum (Al) contacts were deposited by e-beam evaporation. Finally, mechanical scribing down to Mo layer was used to isolate individual devices. Indium was mechanically pressed on an exposed portion of Mo film along one side of the device array as contact.

CIGS Solar Cell Performance: Impact of Na Doping

As mentioned above, CIGS solar cells were fabricated for the purposes of determining the impact of Na doping on CIGS absorber layer morphology and photovoltaic performance. Within this context, a comparison of devices fabricated without Na (control, 35-2-1 to 35-2-13) or with Na (0.25 mol %, 35-3-1 to 35-3-13) is provided in the following section.

Figure 3:
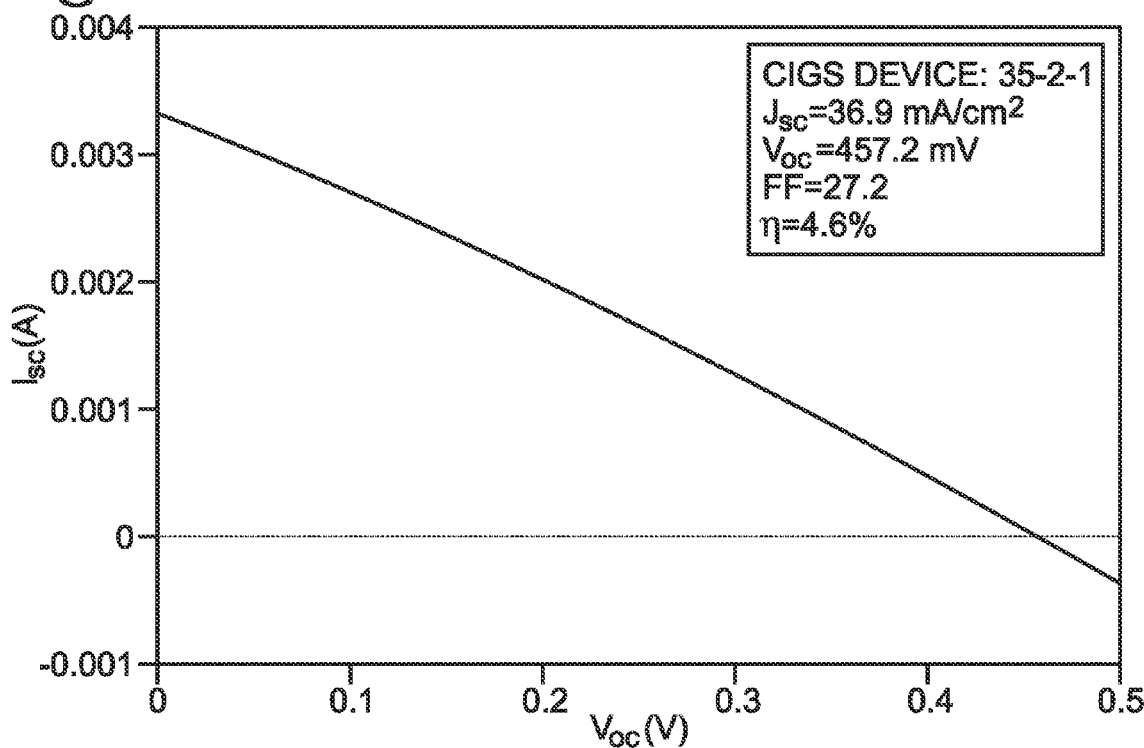
FIG. 3 is a graph depicting the current-voltage (I-V) curve for the best control CIGS solar cell (no Na, 35-2-1).

FIG. 3 is a graph depicting the current-voltage (I-V) curve for the best control CIGS solar cell (no Na, 35-2-1). $J_{sc}$=36.9 mA/cm$^2$, $V_{oc}$=457.2 mV, FF=27.2, η=4.6% [y-axis: $I_{sc}$ in amperes (A); x-axis: $V_{oc}$ in volts (V)]. Overall, the CIGS device performance is characterized by high $J_{sc}$ (36.9 mA/cm$^2$) and good $V_{oc}$ (457.2 mV. A summary of PV performance values ($J_{sc}$, $V_{oc}$, FF and η) for thirteen representative control CIGS devices (35-2-1 to 35-2-13) is provided in Table 1.

TABLE 1

Summary of photovoltaic data for control CIGS solar cells 35-2-1 to 35-2-13: short-circuit current density ($J_{sc}$), open-circuit voltage ($V_{oc}$), fill factor (FF) and efficiency (η).

| Device | $J_{sc}$ (mA/cm$^2$) | $V_{oc}$ (mV) | FF | η (%) |
|---|---|---|---|---|
| 35-2-1 | 36.9 | 457.2 | 27.2 | 4.6 |
| 35-2-2 | 35.2 | 448.1 | 29.3 | 4.6 |
| 35-2-3 | 32.9 | 450.1 | 30.1 | 4.5 |
| 35-2-4 | 28.4 | 436.6 | 32.6 | 4.1 |
| 35-2-5 | 31.4 | 377.6 | 31.3 | 3.7 |
| 35-2-6 | 26.3 | 443.2 | 27.9 | 3.3 |
| 35-2-7 | 26.4 | 447.9 | 27.4 | 3.2 |
| 35-2-8 | 25.1 | 442.2 | 28.4 | 3.1 |
| 35-2-9 | 23.8 | 454.4 | 28.3 | 3.1 |
| 35-2-10 | 23.5 | 456.3 | 27.2 | 2.9 |
| 35-2-11 | 21.7 | 454.1 | 28.8 | 2.8 |
| 35-2-12 | 20.5 | 456.2 | 27.9 | 2.6 |
| 35-2-13 | 20.8 | 451.5 | 27.1 | 2.6 |
| Average Values | 27.1 mA/cm$^2$ | 444.3 mV | 28.7 | 3.47% |

Figure 4:
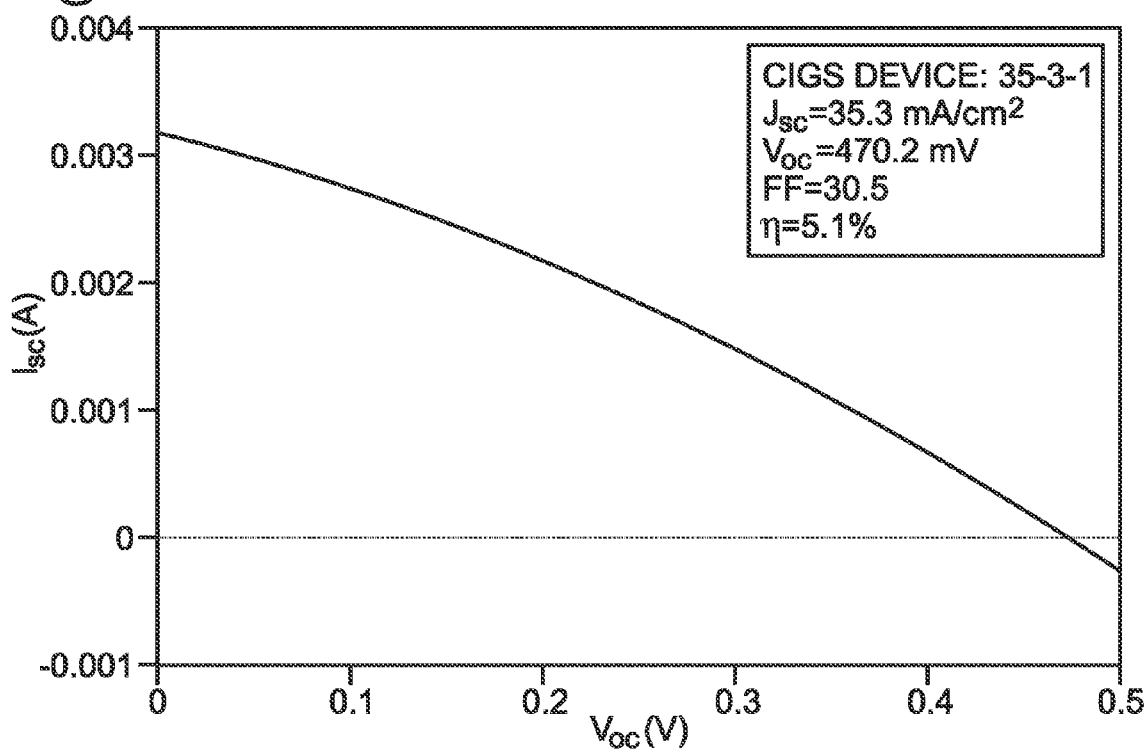
FIG. 4 is a graph depicting the I-V curve for the best Na-doped CIGS solar cell (0.25 mol % Na, 35-3-1).

FIG. 4 is a graph depicting the I-V curve for the best Na-doped CIGS solar cell (0.25 mol % Na, 35-3-1). $J_{sc}$=35.3 mA/cm$^2$, $V_{oc}$=470.2 mV, FF=30.5, η=5.1% [y-axis: $I_{sc}$ in amperes (A); x-axis: $V_{oc}$ in volts (V)]. Overall, the Na-doped CIGS device performance is characterized by both high $J_{sc}$ (32.9 mA/cm$^2$) and high $V_{oc}$ (470.2 mV). A summary of PV performance values ($J_{sc}$, $V_{oc}$, FF and η) for thirteen representative CIGS devices (35-3-1 to 35-3-13) is provided in Table 2.

TABLE 2

Summary of photovoltaic data for Na-doped CIGS solar cells 35-3-1 to 35-3-13: short-circuit current density ($J_{sc}$), open-circuit voltage ($V_{oc}$), fill factor (FF) and efficiency (η).

| Device | $J_{sc}$ (mA/cm$^2$) | $V_{oc}$ (mV) | FF | η (%) |
|---|---|---|---|---|
| 35-3-1 | 35.3 | 470.2 | 30.5 | 5.1 |
| 35-3-2 | 34.8 | 464.3 | 29.1 | 4.7 |
| 35-3-3 | 33.7 | 474.0 | 27.6 | 4.4 |
| 35-3-4 | 32.6 | 444.5 | 29.0 | 4.2 |
| 35-3-5 | 28.8 | 483.5 | 30.2 | 4.2 |
| 35-3-6 | 27.5 | 466.8 | 31.6 | 4.1 |
| 35-3-7 | 29.9 | 477.8 | 28.8 | 4.1 |
| 35-3-8 | 27.1 | 474.2 | 31.2 | 4.0 |
| 35-3-9 | 25.5 | 463.7 | 32.2 | 3.8 |
| 35-3-10 | 25.2 | 469.4 | 32.3 | 3.8 |
| 35-3-11 | 25.2 | 483.5 | 30.4 | 3.7 |
| 35-3-12 | 23.6 | 482.4 | 31.5 | 3.6 |
| 35-3-13 | 25.8 | 467.8 | 30.2 | 3.6 |
| Average Values | 28.8 mA/cm$^2$ | 470.9 mV | 30.4 | 4.10% |

As can be seen from the PV performance summaries provided in Tables 1 and 2, the best CIGS solar cell of 26 total (13 control and 13 Na-doped) demonstrated η=5.1%, which corresponds to a device featuring a Na-doped CIGS absorber layer. Noteworthy is the fact that Na-doped CIGS devices (35-3-1 to 35-3-13, Table 2) demonstrate higher average $J_{sc}$, $V_{oc}$, FF, and η relative to control devices (35-2-1 to 35-2-13, Table 1). As discussed below, the positive impact of Na doping on CIGS performance is further clarified in terms of the distribution of PV values for thirteen individual devices each representing control (no Na) and Na-doped device sets. Finally, the observed PV enhancement with integrated Na-doping was well correlated with CIGS absorber layer morphology as verified through SEM cross-sectional analysis (not shown).

Figure 5:
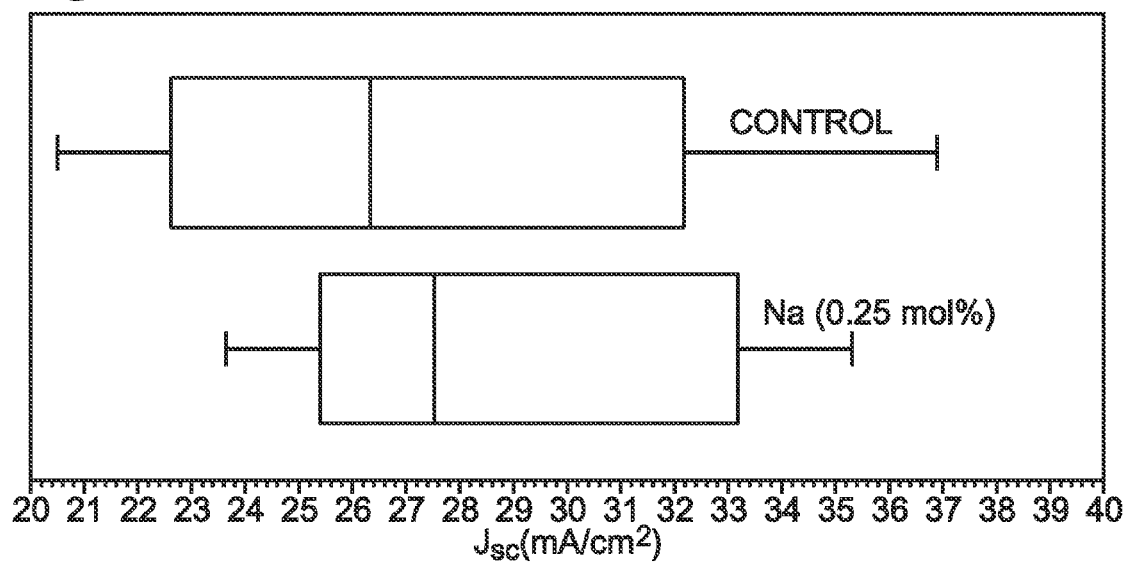
FIG. 5 is a box plot representing the data range distribution of short-circuit current densities ($J_{sc}$) for control (35-2-1 to 35-2-13) and Na-doped (35-3-1 to 35-3-13) CIGS solar cells.

FIG. 5 is a box plot representing the data range distribution of short-circuit current densities ($J_{sc}$) for control (35-2-1 to 35-2-13) and Na-doped (35-3-1 to 35-3-13) CIGS solar cells. In the plot, median values are represented by the vertical line within the boxes. The medians for the low and high value ranges are indicated by the vertical lines comprising the left and right sides of the rectangles, respectively. The range of measured values for 13 individual CIGS solar cells each for control and Na-doped devices are indicated by the horizontal lines extending from the left and right sides of the rectangles. Although the highest absolute $J_{sc}$ was obtained for the control CIGS solar cell (35-2-1, no Na), comparable values were observed for both device sets. However, $J_{sc}$ values for 12 out of 13 Na-doped CIGS solar cells were >25 mA/cm$^2$ (see Table 2). Furthermore, although a $J_{sc}$ as low as 20.5 mA/cm$^2$ was obtained for the control devices, the lowest value for Na-doped CIGS was 23.6 mA/cm$^2$. With the exception of the highest absolute $J_{sc}$ for the control CIGS solar cell, the values of the median and upper/lower quartiles (corresponding to upper and lower medians) are greater for the Na-doped CIGS solar cells relative to control devices. Finally, $J_{sc}$ values for 4 of the control devices (no Na) were lower than the absolute lowest value measured for Na-doped CIGS solar cells (See Tables 1-2).

Figure 6:
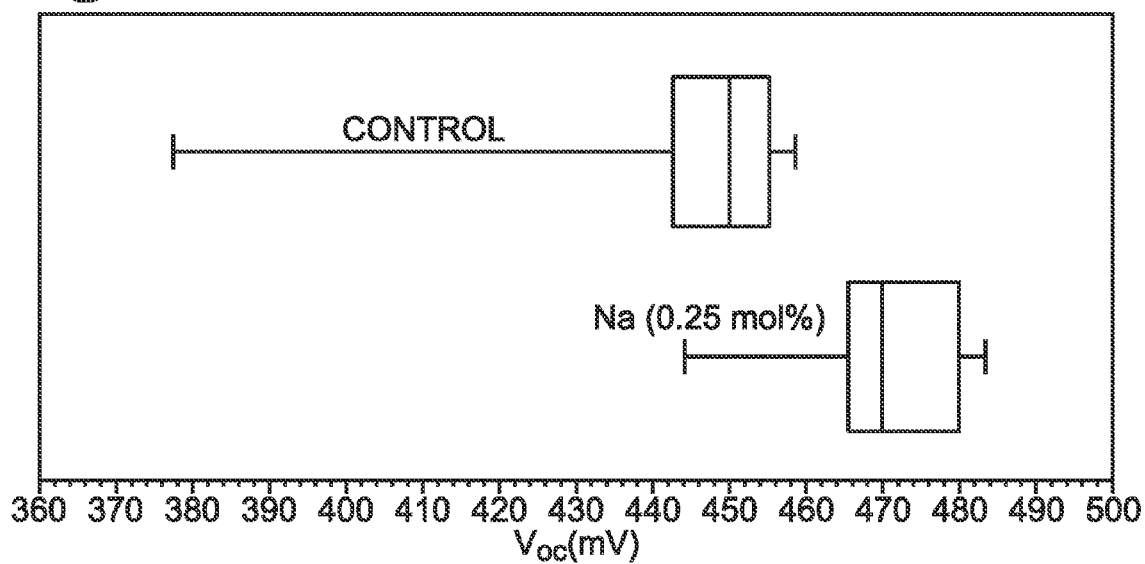
FIG. 6 is a box plot representing the data range distribution of open-circuit voltages ($V_{oc}$) for control (35-2-1 to 35-2-13) and Na-doped (35-3-1 to 35-3-13) CIGS solar cells.

FIG. 6 is a box plot representing the data range distribution of open-circuit voltages ($V_{oc}$) for control (35-2-1 to 35-2-13) and Na-doped (35-3-1 to 35-3-13) CIGS solar cells. In the plot, median values are represented by the vertical line within the boxes. The medians for the low and high value ranges are indicated by the vertical lines comprising the left and right sides of the rectangles, respectively. The range of measured values for 13 individual CIGS solar cells each for control and Na-doped devices are indicated by the horizontal lines extending from the left and right sides of the rectangles. Overall, the highest absolute $V_{oc}$ was demonstrated by the Na-doped CIGS solar cell (35-3-1, 483.5 mV). Noteworthy is the fact that greater than 90% of the $V_{oc}$ values for the Na-doped CIGS devices were higher than the highest $V_{oc}$ for the control CIGS device set (see Tables 1-2).

The observed enhancements in $V_{oc}$ for Na-doped CIGS solar cells (versus control) are consistent with an improvement in CIGS absorber layer morphology, whereby improved grain size and reduced grain boundaries are expected to suppress the tendency for recombination events within the CIGS layer. Finally, the most convincing argument in support of the beneficial impact of Na-doping in the solution-processed CIGS absorber layer approach is unambiguously established through the $V_{oc}$ data.

Figure 7:
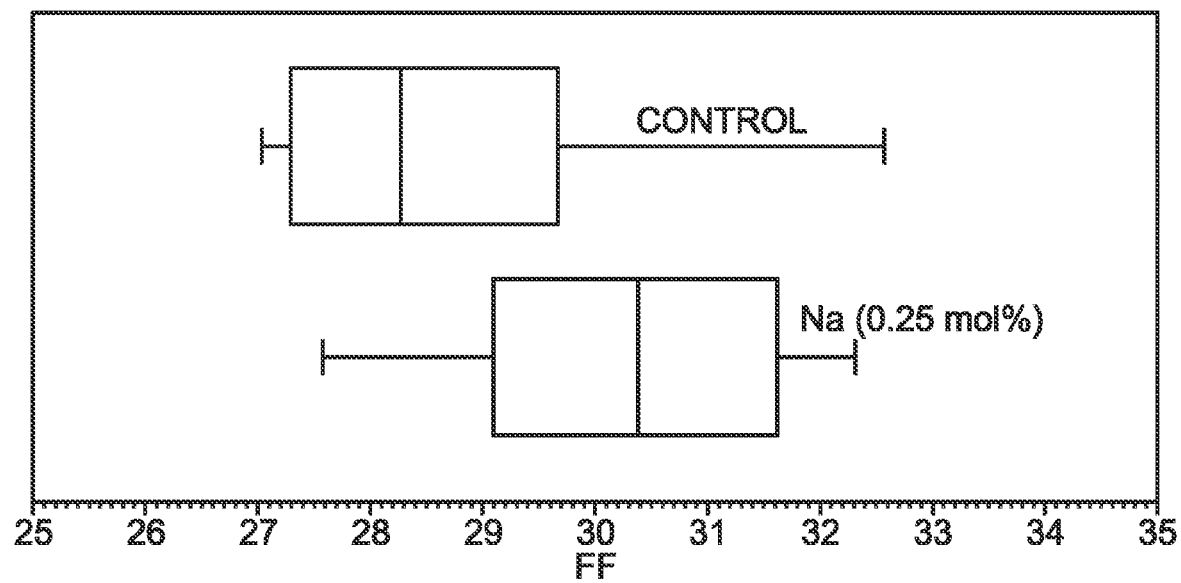
FIG. 7 is a box plot representing the data range distribution of fill factors (FF) for control (35-2-1 to 35-2-13) and Na-doped (35-3-1 to 35-3-13) CIGS solar cells.

FIG. 7 is a box plot representing the data range distribution of fill factors (FF) for control (35-2-1 to 35-2-13) and Na-doped (35-3-1 to 35-3-13) CIGS solar cells. In the plot, median values are represented by the vertical line within the boxes. The medians for the low and high value ranges are indicated by the vertical lines comprising the left and right sides of the rectangles, respectively. The range of measured values for 13 individual CIGS solar cells each for control and Na-doped devices are indicated by the horizontal lines extending from the left and right sides of the rectangles.

Although the highest FF was obtained for a control CIGS solar cell (32.6) relative to the best FF for a Na-doped device (32.3), comparable value ranges were observed for both device sets. However, 9 of the Na-doped CIGS solar cells demonstrated FF>30 compared to a total of 3 for the control devices (see Tables 1-2).

Figure 8:
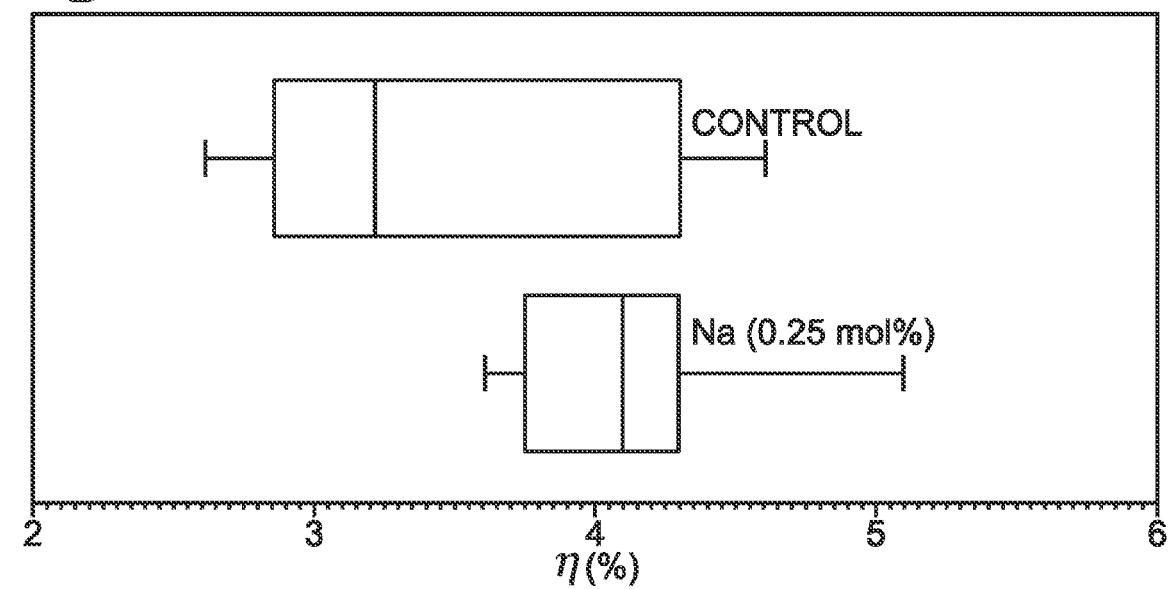
FIG. 8 is a box plot representing the data range distributions of CIGS solar cell efficiencies (η) for control (35-2-1 to 35-2-13) and Na-doped (35-3-1 to 35-3-13) CIGS solar cells.

FIG. 8 is a box plot representing the data range distributions of CIGS solar cell efficiencies (η) for control (35-2-1 to 35-2-13) and Na-doped (35-3-1 to 35-3-13) CIGS solar cells. In the plot, median values are represented by the vertical line within the boxes. The medians for the low and high value ranges are indicated by the vertical lines comprising the left and right sides of the rectangles, respectively. The range of measured values for 13 individual CIGS solar cells each for control and Na-doped devices are indicated by the horizontal lines extending from the left and right sides of the rectangles.

Overall, the highest η was demonstrated by the Na-doped CIGS solar cell (5.1%/o), while the lowest η was obtained for a control device (no Na). Furthermore, greater than 60% of the Na-doped CIGS solar cells demonstrated η≥4% with a lowest η corresponding to 3.6%. In contrast, greater than 60% of control CIGS solar cells demonstrated η<3.6% (~30% at η<3%) along with a lowest device efficiency of 2.6% (See Tables 1-2).

SUMMARY

Conveniently, the Na dopant was deliberately incorporated as a soluble component in the metal precursor solution prior to deposition of the Cu—In—Ga—Na (0.25 mol %) intermediate film. With respect to PV performance, average $J_{sc}$, $V_{oc}$, FF, and η were higher for the Na-doped devices versus control based upon 13 individual solar cells for each Na-doped and control (no Na) device sets. For $V_{oc}$, higher values for Na-doped CIGS were consistent with better absorber layer morphology as confirmed by SEM analysis (not shown). Finally, a percent increase in η corresponding to >18% was demonstrated for the Na-doped CIGS solar cells relative to η for control devices (no Na).

Although Na was employed for proof-of-concept CIGS solar cells, the method is amenable to doping with other alkali metals including lithium (Li), potassium (K) and cesium (Cs). The technology avoids highly toxic materials such as hydrazine, while all formulation, process, and device integration steps can be performed using conventional methods. Low CIGS absorber layer contamination is realized by employing low-boiling solvents and only weakly metal-coordinating additives that are effectively eliminated during thermal processing. CIGS solar cells featuring an Na-doped CIGS absorber layer demonstrated percent increases for individual PV parameters corresponding to 6.3% ($J_{sc}$), 6.0% ($V_{oc}$), 5.9% (FF), and 18.2% (q) relative to control (no Na) based upon average values representing thirteen individual devices each for control and Na-doped CIGS solar cells (26 total CIGS solar cells).

Processes have been provided for forming alkali metal-doped metal chalcogenides using solution-processed metal precursors. Examples of materials and process variables have been presented to illustrate the invention. However, the invention is not limited to merely these examples. More explicitly, the processes described herein are not limited to just sodium dopants and CIGS. Other variations and embodiments of the invention will occur to those skilled in the art.

We claim:

1. A method for forming an alkali metal-doped solution-processed metal chalcogenide, the method comprising:
   providing a conductive substrate;
   forming a first solution including a first material group selected from a first material set consisting of metal salts, metal complexes, and combinations thereof, dissolved in a solvent;
   adding an alkali metal-containing material to the first solution;
   depositing the first solution on the conductive substrate;
   forming an alkali metal-doped first intermediate film comprising metal precursors from corresponding members of the first material group;
   thermally annealing in an environment selected from a group consisting of selenium (Se), Se and hydrogen ($H_2$), hydrogen selenide ($H_2Se$), sulfur (S), S and $H_2$, hydrogen sulfide ($H_2S$), and combinations thereof;
   as a result, transforming the metal precursors in the alkali metal-doped first intermediate film; and,
   forming an alkali metal-doped metal chalcogenide layer.

2. The method of claim 1 wherein the first material set is selected from a group consisting of aluminum (Al), antimony (Sb). arsenic (As), bismuth (Bi), cadmium (Cd), chromium (Cr), cobalt (Co), copper (Cu), gallium (Ga), germanium (Ge), gold (Au), indium (In), iridium (Ir), iron (Fe), lead (Pb), manganese (Mn), mercury (Hg), molybdenum (Mo), nickel (Ni), niobium (Nb), osmium (Os), palladium (Pd), platinum (Pt), rhodium (Rh), ruthenium (Ru), silver (Ag), tantalum (Ta), tin (Sn), titanium (Ti), tungsten (W), vanadium (V), zinc (Zn), zirconium (Zr), and combinations thereof.

3. The method of claim 1 wherein the conductive substrate is selected from a class of materials consisting of metals, metal alloys, metal oxides, mixed metal oxides, and combinations thereof.

4. The method of claim 3 wherein the conductive substrate is selected from a group of materials consisting of aluminum, chromium, cobalt, copper, gallium, germanium, gold, indium, iron, lead, molybdenum, nickel, niobium, palladium, platinum, silicon, silver, tantalum, tin, titanium, tungsten, vanadium, zinc, zirconium, stainless steel, indium tin oxide, fluorine-doped tin oxide, and combinations thereof.

5. The method of claim 1 wherein adding the alkali metal-containing material to the first solution includes adding an alkali material source selected from a group consisting of lithium (Li), sodium (Na), potassium (K), cesium (Cs), and combinations of the above-mentioned metals.

6. The method of claim 1 wherein forming the alkali metal-doped first intermediate film comprising metal precursors includes forming a first proportion of the alkali metal-doped first intermediate film with a material selected from a group consisting of metal oxides and mixed metal oxides.

7. The method of claim 1 further comprising:
   prior to thermal annealing, forming a second solution including a second material group selected from the first material set, dissolved in a solvent;
   depositing the second solution on the alkali metal-doped first intermediate film;
   forming a second intermediate film comprising metal precursors from corresponding members of the second material group; and,
   wherein transforming the metal precursors in the alkali metal-doped first intermediate film additionally includes transforming metal precursors in the second intermediate film.

8. The method of claim 7 further comprising:
   prior to depositing the second solution on the alkali metal-doped first intermediate film, adding an alkali metal-containing material to the second solution;
   wherein forming the second intermediate film includes forming an alkali metal-doped second intermediate film; and,
   wherein transforming the metal precursors in the second intermediate film includes transforming metal precursors in the alkali metal-doped second intermediate film.

9. The method of claim 1 further comprising:
   prior to depositing the first solution, forming a second solution including a second material group selected from the first material set, dissolved in a solvent;
   depositing the second solution overlying and in direct contact with the conductive substrate;
   forming a second intermediate film comprising metal precursors from corresponding members of the second material group;
   wherein forming the alkali metal-doped first intermediate film includes forming the alkali metal-doped first intermediate film overlying and in direct contact with the second intermediate film; and,
   wherein transforming the metal precursors in the alkali metal-doped first intermediate film additionally includes transforming metal precursors in the second intermediate film.

10. The method of claim 1 further comprising:
    prior to thermally annealing, forming a plurality of intermediate films overlying the alkali metal-doped first intermediate film.

11. The method of claim 1 further comprising:
    prior to thermally annealing, forming a plurality of alkali metal-doped intermediate films overlying the alkali metal-doped first intermediate film.

12. The method of claim 1 further comprising:
    as a result of thermally annealing, transforming at least some proportion of metal-containing materials in the conductive substrate; and,
    forming a layer in the conductive substrate selected from a group consisting of a metal selenide and a metal sulfide, underlying the alkali metal-doped metal chalcogenide layer.

13. A method for forming a sodium-doped solution-processed metal chalcogenide, the method comprising:
    providing a conductive substrate;
    forming a first solution including a first material group selected from a first material set consisting of metal salts, metal complexes, and combinations thereof, dissolved in a solvent;
    adding a sodium-containing material to the first solution;
    depositing the first solution on the conductive substrate;
    forming a sodium-doped first intermediate film comprising metal precursors from corresponding members of the first material group;
    thermally annealing in an environment selected from a group consisting of selenium (Se), Se and hydrogen ($H_2$), hydrogen selenide ($H_2Se$), sulfur (S), S and $H_2$, hydrogen sulfide ($H_2S$), and combinations thereof;
    as a result, transforming the metal precursors in the sodium-doped first intermediate film; and,
    forming a sodium-doped metal chalcogenide layer.

14. The method of claim 13 wherein the first material set is selected from a group consisting of copper (Cu), indium (In), gallium (Ga), and combinations of the above-mentioned materials.

15. The method of claim 14 wherein thermally annealing includes thermally annealing in an environment selected from a group consisting of Se, Se and $H_2$, $H_2Se$, and combinations of the above-mentioned materials; and,
  wherein forming the sodium-doped metal chalcogenide includes forming a sodium-doped Cu—In—Ga—Se composite material (CIGS).

16. The method of claim 13 further comprising:
  prior to thermal annealing, forming a second solution including a second material group selected from the first material set, dissolved in a solvent;
  depositing the second solution on the sodium-doped first intermediate film;
  forming a second intermediate film comprising metal precursors from corresponding members of the second material group; and,
  wherein transforming the metal precursors in the sodium-doped first intermediate film additionally includes transforming metal precursors in the second intermediate film.

17. The method of claim 16 further comprising:
  prior to depositing the second solution on the sodium-doped first intermediate film, adding a sodium-containing material to the second solution;
  wherein forming the second intermediate film includes forming a sodium-doped second intermediate film; and,
  wherein transforming the metal precursors in the second intermediate film includes transforming metal precursors in the sodium-doped second intermediate film.

18. The method of claim 13 further comprising:
  prior to depositing the first solution, forming a second solution including a second material group selected from the first material set, dissolved in a solvent;
  depositing the second solution overlying and in direct contact with the conductive substrate;
  forming a second intermediate film comprising metal precursors from corresponding members of the second material group;
  wherein forming the sodium-doped first intermediate film includes forming the sodium-doped first intermediate film overlying and in direct contact with the second intermediate film; and,
  wherein transforming the metal precursors in the sodium-doped first intermediate film additionally includes transforming metal precursors in the second intermediate film.

19. The method of claim 13 further comprising:
  prior to thermally annealing, forming a plurality of intermediate films overlying the sodium-doped first intermediate film.

20. The method of claim 13 further comprising:
  prior to thermally annealing, forming a plurality of sodium-doped intermediate films overlying the sodium-doped first intermediate film.

21. The method of claim 13 further comprising:
  as a result of thermally annealing, transforming at least some proportion of metal-containing materials in the conductive substrate; and,
  forming a layer in the conductive substrate selected from a group consisting of a metal selenide and a metal sulfide, underlying the sodium-doped metal chalcogenide layer.

* * * * *